United States Patent [19]

Raatz et al.

[11] Patent Number: 5,333,119
[45] Date of Patent: Jul. 26, 1994

[54] DIGITAL SIGNAL PROCESSOR WITH DELAYED-EVALUATION ARRAY MULTIPLIERS AND LOW-POWER MEMORY ADDRESSING

[75] Inventors: Donovan L. Raatz, New Germany; Gerald E. Sobelman, Minnetonka, both of Minn.

[73] Assignee: Regents of the University of Minnesota, Minneapolis, Minn.

[21] Appl. No.: 954,571

[22] Filed: Sep. 30, 1992

[51] Int. Cl.$^5$ .............................................. G06F 7/52
[52] U.S. Cl. .................... 364/760; 364/707; 364/724.16
[58] Field of Search ............ 364/760, 754, 707, 724.16

[56] References Cited

U.S. PATENT DOCUMENTS

| | | | |
|---|---|---|---|
| 3,535,498 | 5/1967 | Smith, Jr. | 364/752 |
| 4,121,295 | 10/1978 | Witt | 364/724.16 |
| 4,168,530 | 9/1979 | Gajski et al. | 364/760 |
| 4,441,158 | 4/1984 | Kanuma | 364/758 |
| 4,598,382 | 7/1986 | Sato | 364/757 |
| 4,745,570 | 5/1988 | Diedrich et al. | 364/760 |
| 4,748,584 | 5/1988 | Noda | 364/760 |
| 4,809,212 | 2/1989 | New et al. | 364/757 |
| 4,910,701 | 3/1990 | Gibbons et al. | 364/760 |
| 4,982,355 | 1/1991 | Nishimura et al. | 364/758 |
| 5,060,183 | 10/1991 | Sakashita et al. | 364/757 |

Primary Examiner—David H. Malzahn
Attorney, Agent, or Firm—Jay H. Maioli

[57] ABSTRACT

A digital signal processor including a digital FIR filter and memory for storing filter coefficients operates at a reduced power level by using array multipliers that calculate partial products only when the partial products in a preceding row of the array have stabilized. The dynamic CMOS adder arrays in each multiplier are triggered to perform their evaluations only after predetermined time periods have elapsed, which are sufficient to permit the preceding row to stabilize. Coefficients are addressed from the memory using low-power addressing circuits, such as a Gray code counter or a one-bit wide circular shift register, so that the overall digital signal processor consumes a reduced amount of power during memory addressing.

8 Claims, 5 Drawing Sheets

DIGITAL SIGNAL PROCESSOR WITH DELAYED-EVALUATION ARRAY MULTIPLIERS AND LOW-POWER MEMORY ADDRESSING

BACKGROUND OF THE INVENTION

1. Field of the Invention

This invention relates generally to digital signal processors including digital filters and, more particularly, to a multiplier for use in such digital filter and to low-power addressing circuits for addressing a memory used in the digital signal processor.

2. Description of the Background

Great strides have been recently made in increasing the density of the circuits implemented on integrated circuit chips and to increasing the speed with which such chips can operate. Systems that were heretofore thought too large to be incorporated into a single integrated circuit chip have now been fabricated as integrated circuits. For example, digital signal processors have now been implemented as integrated circuits, generally using the CMOS technology. Thus, the emphasis so far has been on increasing the density, that is, increasing the number of transistors that can be provided on an integrated circuit chip and to increasing the so-called throughput, that is, the speed with which data can be manipulated or processed. Integrated circuit chips are generally provided in systems that have relatively unlimited power supplies, that is, operated either from large solar cells and battery combinations or from standard AC mains. The problem now arises that in some applications for these high-density, sophisticated integrated circuit chips the power supplies have not kept pace with the integrated circuit technology. Thus, applications arise in which designers wish to use sophisticated integrated circuits but do not have sufficient battery power to use such circuits. For example, a watch or a hearing aid might be a suitable application for a digital signal processing system but the power available from the batteries is insufficient to provide a commercially acceptable product.

In regard to digital signal processors, they are typically embodied by a digital finite impulse response (FIR) filter that is commonly known to include one or more multipliers, an accumulator, a memory for coefficient storage, and some delay circuit or memory to store previous input words. As is known, these multipliers tend to be the most power consuming of all of the circuit elements in the digital FIR filter. As noted above, the CMOS technology is generally favored for high density integrated circuits of this kind, and it is known that the power dissipation of a CMOS circuit is given generally by the following equation: $P = CV^2F$, where $V^2$ is the supply voltage times the voltage swing between circuit states, C is the output load capacitance when the circuit is a simple gate, and F is the clock frequency. Because a digital FIR filter may include a large number of multipliers, the capacitance value is quite high or if the multipliers are connected so that they may be used repeatedly and thereby reduce the required number, the clock frequency will be increased to a high rate. Therefore, it is seen that the multiplier is one of the single most power hungry elements in the digital FIR filter.

Another area in the digital signal processor in which power consumption may be reduced is in the addressing of both the memory that stores the coefficients used to achieve the desired transfer function and the memory that stores the delayed data samples in the digital FIR filter. If a random access memory (RAM) is employed then it is traditionally addressed using a binary counter. This addressing system utilizes more power than the methods in this invention for addressing in low-power battery applications.

OBJECTS AND SUMMARY OF THE INVENTION

Accordingly, it is an object of the present invention to provide a digital signal processor that can operate with low power consumption and that can eliminate the above-noted defects inherent in the prior art.

Another object of the present invention is to provide a digital signal processor including a digital FIR filter utilizing specialized multipliers that are controlled so that a delayed evaluation occurs.

Another object of the present invention is to provide a digital signal processor including a digital FIR filter in which the memory storing the coefficients used to achieve the desired transfer function of the filter and/or the memory storing the delayed input samples is addressed by low-power addressing circuits.

According to one aspect of the present invention, the digital signal processor arranged as a FIR filter includes a delayed evaluation array multiplier that computes partial products using an array of full and half adders in which each partial product is computed only after all of its input values have stabilized, that is, any one row of the adders in the array multiplier will be evaluated only after the previous row of adders has completed its evaluation.

According to another aspect of the present invention, a circuit employing a shift register is provided to address the memory in a digital signal processor, in which the shift register is constructed to employ a minimum amount of power. The shift register circuit can be a one-bit wide circular shift register connected to the word lines of a memory and is loaded with a single "1" digit that shifts in position to address the next word of the memory.

According to a further aspect of the present invention, an address circuit for a memory is provided that employs the Gray code sequence in place of the traditional binary sequence. By utilizing the Gray code the transition between addresses includes only a single bit address transition. Power dissipation is reduced, because it is known that the power dissipation of a counter is proportional to the number of bits changing during a given count transition.

The manner in which the above and other objects, features, and advantages of the present invention are achieved will become apparent from the following detailed description of illustrative embodiments thereof, to be read in connection with the accompanying drawings, in which like reference numerals represent the same or similar elements.

DETAILED DESCRIPTION OF PREFERRED EMBODIMENTS

Figure 1:
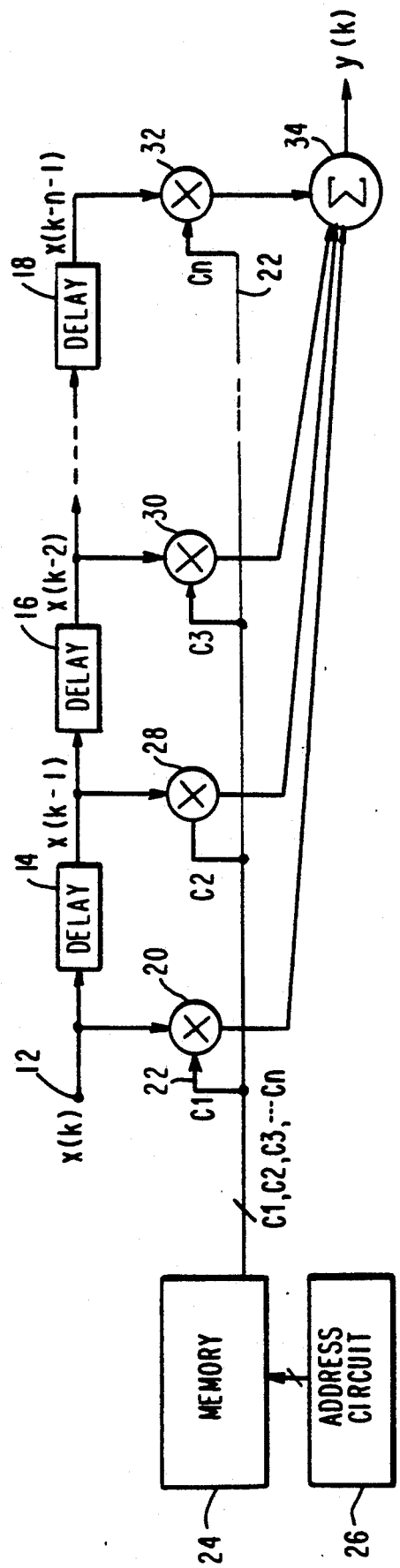
FIG. 1 is a circuit diagram of a known digital FIR filter including a memory for coefficient storage.

In FIG. 1 a digital signal processor including a digital FIR filter is shown in conjunction with a memory typically used to store coefficients to achieve the desired transfer function of the filter. More specifically, in FIG. 1 a digital input signal x(k) is provided at input terminal 12 and is then replicated through a suitable mechanism, such as by storing such previous words. Such mechanism can be represented as a series of individual delays, such as shown at 14, 16, and 18 in FIG. 1, or it may be achieved by a memory or by a multiple-tap delay line. The input signal is also fed to a first multiplier 20, where it is multiplied by a coefficient C1 on line 22. That coefficient is derived from a memory 24 that is suitably addressed by an address circuit 26, as will be explained hereinbelow, to provide the coefficients. As is well known, a number of additional multipliers 28, 30, and 32 are provided, each of which has one input derived from the output of a respective delay line and the other input being the coefficient for that multiplier, as read from the memory 24 on lines 22. Alternatively, a fewer number of multipliers may be used repeatedly at a frequency higher than the data input rate. After the input word has been multiplied by the respective coefficients in the multipliers, the outputs of the multipliers are summed or accumulated in a summing circuit 34 whose output signal y(k), which is the input signal x(k) having been transformed in keeping with the desired transfer function. It is understood, of course, that the digital FIR filter in FIG. 1 shows only three taps or three delays, however, FIR's of this nature typically employ a large number of taps. Therefore, these multipliers may be many in number and/or they may be clocked at a high frequency, leading to a high overall power consumption. The present invention provides a system for lowering the power required by each multiplier.

There are many different kinds of multipliers that are available for use in a digital FIR filter, for example, a Baugh-Wooley parallel multiplier, a parallel multiplier using a modified Booth recoding, a serial-parallel multiplier and a serial-parallel multiplier with modified Booth recoding. The inventors herein have determined that a parallel multiplier utilizing modified Booth recoding can be controlled to utilize much less power than any other such multiplier known heretofore, yet still operate at a rate to provide sufficient data processing. Nevertheless, the present invention is also applicable to other kinds of array multiplier architecture, such as the Braun unsigned array multiplier, direct two's complement array multiplier, Pezaris array multiplier, the Baugh-Wooley array multiplier mentioned above, as well as modified Booth recoding array multipliers.

The Booth algorithm was first proposed in 1951 and the modified form thereof evolved later. The basic idea of the Booth algorithm is that in multiplication of any two arbitrary digital numbers, which occurs by simply multiplying the digits of the multiplicand by the individual digits of the multiplier, many of the partial products that result from this multiplication will be zero and do not contribute to the finding of the final product. Thus, the concept of the modified Booth algorithm is that by looking at the multiplier one can find the redundancies of the partial products, which is similar to finding which partial products will be zero, and then use this information to reduce the size of the partial product array.

Figure 2:
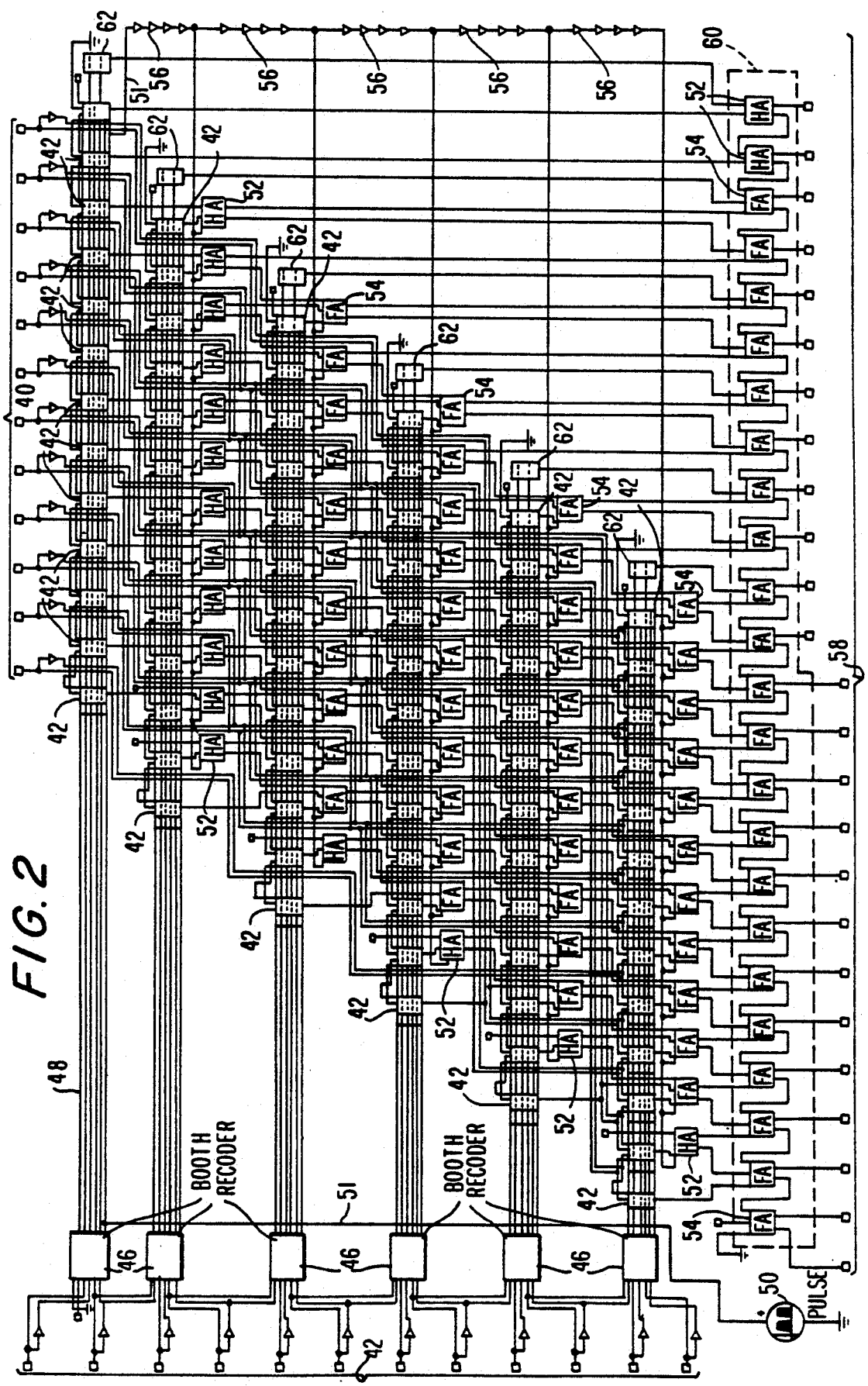
FIG. 2 is a circuit diagram of a parallel multiplier using modified Booth recoding and delay evaluation according to an embodiment of the present invention.

A detailed explanation of the modified Booth multiplier is found in "The design of an LSI Booth Multiplier: NMOS vs. CMOS Technology," Annaratone and Shen, CMU-CS-84-150 (1984) and in Digital MOS Integrated Circuits: Designs for Applications," N. Wang, Prentice-Hall, Englewood Cliffs, N.J. (1989). A low-power parallel multiplier utilizing the modified Booth recoding algorithm and delay evaluation according to the embodiment of the present invention is shown in FIG. 2. The parallel multiplier is embodied of dynamic CMOS circuits and computes the partial products of a multiplication operation using an array of full and half adders. The adders are implemented so that each partial product is computed only after all the respective input values have stabilized. A clock signal is provided to control the evaluation of the dynamic circuits and is delayed so that a given row of adders in the array, which corresponds to one partial product, will evaluate, that is, produce the partial product, only after the previous row of adders, which corresponds to the next less significant partial product, has completed its evaluation. As will be explained in detail, the evaluation delays are implemented using a chain of inverters that are tapped corresponding to the evaluation signal for each row of adders.

Generally, it is known to implement the adders in an array multiplier using static CMOS circuits that do not require an evaluation signal and produce output values in direct response to any changes at the respective inputs. In the context of the array multiplier, this results in temporary transitions at internal points at the array. These transitions occur because there is no control over the order of evaluation of the individual adders in the array. Power is consumed each time a circuit node switches between logic low and logic high. Therefore, the large number of temporary transitions occurring in the array will contribute to the significant amount of total power dissipation typically exhibited by this kind of multiplier. The delayed evaluation technique taught by the present invention eliminates these temporary transitions. Thus, each row of adders in the array will exhibit logic transitions only once, at the occurrence of the evaluate signal for the specific row. The following row or subsequent row will compute its new values then only after the output values of the current or preceding row have become stable and even additional power savings occurs due to the fact that the dynamic adders typically have less parasitic capacitance then do static CMOS adders.

The present invention uses a tapped chain of inverters to insure that the rows evaluate in the intended sequence and only at the intended time points. In the embodiment of FIG. 2, the digital multiplicand is input to the terminals 40 at the top of the circuit and each digit is fed into select boxes, shown typically at 42. The digital multiplier is fed into the terminals shown generally at 42 and is connected to six Booth recoders, shown typically at 46, according to the known grouping of the modified Booth algorithm. The outputs of the Booth recoders 46 are in the form of five lines forming a horizontal bus that runs between respective recoders and the select boxes, which will be described below. A six line bus is shown typically at 48 and five of the six lines are produced by the Booth recoders 46 and the sixth line is a clock signal produced by a pulse generator 50. Thus, the recoded signal that has been recoded according to the modified booth algorithm is sent via the multi-line bus 48 to the select boxes 42. These multi-line buses are the connection lines arranged horizontally across the array shown in FIG. 2. Depending upon which of these five lines from Booth recoder 46 is asserted, the select boxes 42 select either $A_n$, $A_{n-1}$, $A_n'$, $A_{-1}'$, or zero. The combination of the outputs of all of the select boxes in a row forms a partial product. These partial products are then added by the array of half adders 52 and full adders 54. That is, each row of select boxes 42 produces partial products that are added with terms from preceding rows in a row of adders, and so on.

The half adders 52 and full adders 54 are implemented using dynamic CMOS using the inventive delayed evaluation concept described above. More specifically, the clock signal on line 51 from the clock generator 50 is fed through a plurality of clock delay inverters, shown typically at 56, that are arranged at the right side of the schematic of FIG. 2. Each tap point shown is connected to the precharge and evaluate transistors of the dynamic CMOS adders in the corresponding row of the adder array. Thus, each row of adders made up of half adders 52 and full adders 54 is sequentially evaluated only after sufficient time has elapsed to permit the preceding row to have stabilized. The product of the multiplicand 40 and multiplier 44 appears at the outputs 58 and is produced by an array of full adders 54 and half adders 52 arranged as a ripple-carry adder in the known configuration and shown within dashed line 60.

Because the Booth recoders 46 operate in twos complement logic the "0" and "1" lines of bus 48 are fed to an add-one generator 62 that takes care of the additional bit problem and outputs an extra "1" to the ripple carry adder 60.

Figure 3:
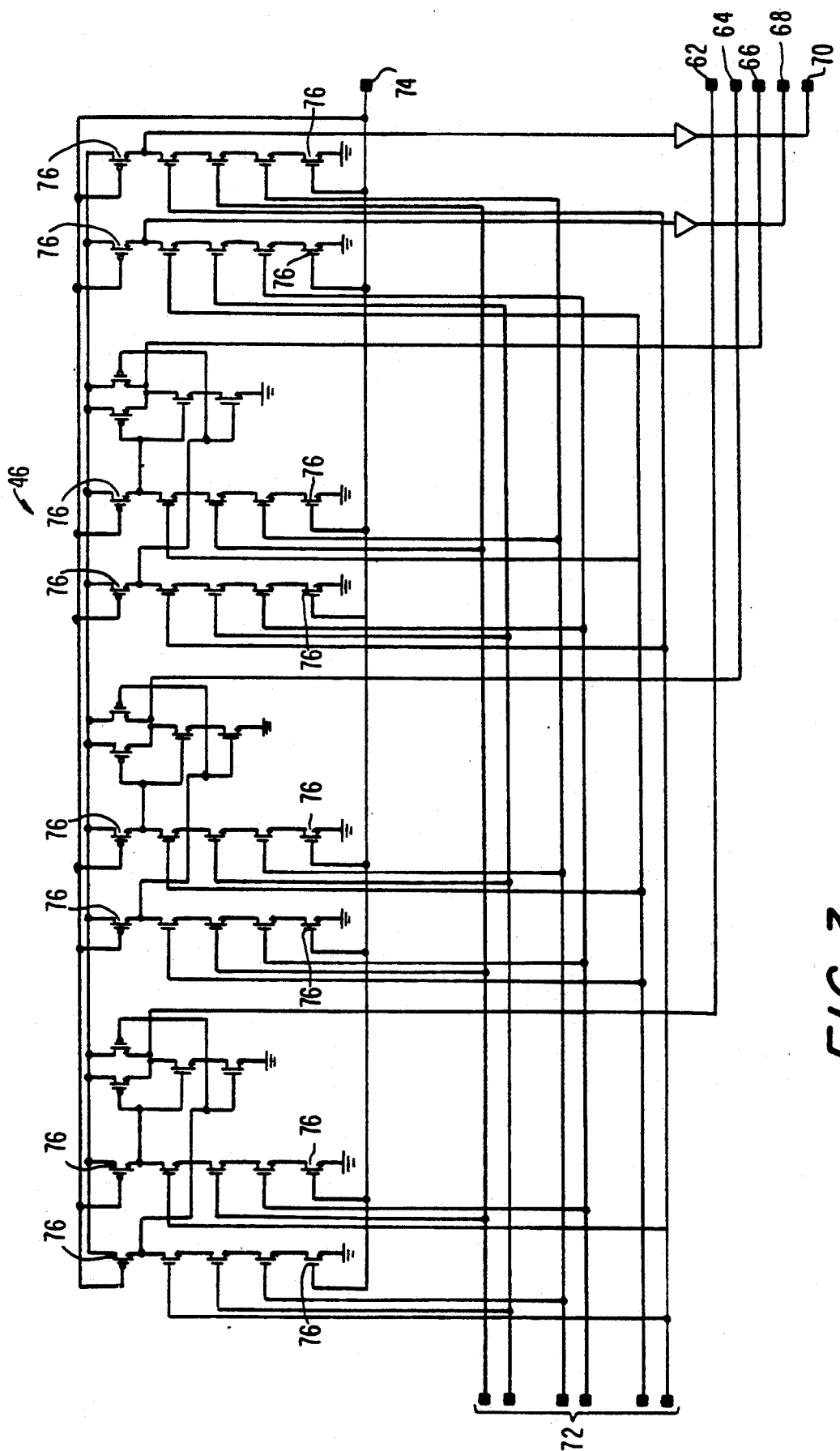
FIG. 3 is a circuit diagram of a Booth recoder known in the prior art and employed in the embodiment of FIG. 2.

FIG. 3 shows the Booth recoder 46 used in the embodiment of FIG. 2 in more detail. As described hereinabove, the purpose of the Booth recoder 46 is to perform table look-up based upon the modified Booth algorithm to determine what the partial product should be. The inputs to the Booth recoder in accordance with the known Booth algorithm are three consecutive bits of the multiplier, in true and complement form, forming one group with such groups of three being divided up in the known manner as described in the above-identified publications. The output of each Booth recoder 46 is a "1" on one line and a "0" on the remaining four lines, with each line corresponding to a partial product possibility. The outputs of the Booth recoder 46 shown in FIG. 3 are at line 66 that represents the partial product is 0, line 62 that represents the partial product is A, line 70 that represents the partial product A shifted left one bit position, that is, $A_{n-1}$ line 64 that represents the partial product is the twos complement of A, (A') and line 68 that represents the partial product is the twos complement of A shifted left one bit position $A'_{n-1}$. The Booth recoder 46 is formed of a number of transistors connected as NAND gates in the known fashion and connected to receive the group of input bits at inputs 72 derived from the multiplier word 44. A clock signal denoted phase 1 is provided at input terminal 74 and acts as a pre-charging signal fed to precharge and evaluate transistors, shown typically at 76.

Figure 4:
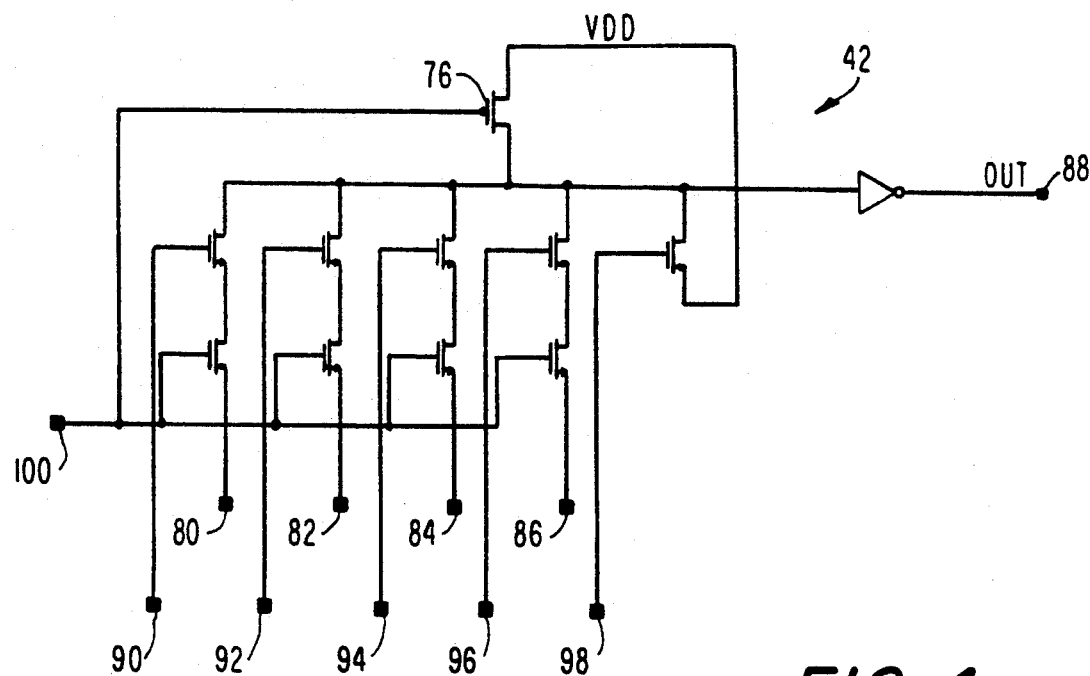
FIG. 4 is a circuit diagram showing a select box known in the prior art and employed in the embodiment of FIG. 2 shown in more detail.

FIG. 4 shows the select box 42 in more detail. In the embodiment shown in FIG. 2 a 12-bit multiplicand is being multiplied by a 12-bit multiplier, and this results in six partial products. Accordingly, the present invention provides thirteen select boxes 42 per partial product, so that a total of 78 select boxes 42 are employed in the embodiment shown in FIG. 2. Each select box 42 has data terminal 80 for partial product $A_n$, terminal 82 for partial product $A_{n-1}$, terminal 84 for $A'_n$ and terminal 86 for $A'_{n-1}$. These data terminals have the above values just waiting to be fed to output 88 under command of control terminals 90-98. Of course, as pointed out above, the purpose of each select box 42 is to generate a correct bit of the partial product. For example, the function of a select box associated with bit $A_n$ of the Booth recoder output is shown in FIG. 4, for example, and described as follows. If the desired partial product as determined by the Booth recoder 46 is "0" then the output on line 66 in the Booth recoder of FIG. 3 connected to the control terminal 98 is high and the output of the select box 42 is zero. If the desired partial product of Booth decoder 46 is A, then line 62 connected to control terminal 94 is high and the output of the select box is $A_n$. If the desired partial product determined by booth recoder 46 is A shifted left one bit position, then the signal on line 70 connected to terminal 96 is high and the output of the select box $A_{n-1}$. If the desired partial product determined by Booth recoder 46 is the twos complement of A, then line 64 connected to terminal 90 is high and the output of select box 42 is $A_n'$. Finally, if the desired partial products determined by Booth recoder 46 is the twos complement of A shifted left one bit position, then line 68 connected to terminal 92 is high, all other outputs are low, and the output of the select box 42 is $A_{n-1}'$. The clock signal phase one is fed to input terminal 100 to precharge transistors 76, as in the circuit of FIG. 3.

As described above, in this embodiment showing an example of a 12-bit multiplicand and 12-bit multiplier, there will be six partial products and these partial products are added up using corresponding arrays of full and half adders. Such adders are typically implemented in dynamic CMOS in keeping with the delayed evaluation concept provided by the present invention and under control of the delayed clock signals, wherein the clock signal on line 51 is passed through a number of inverters, typically shown at 56, that provide a time delay to the clock signals. Thus, the clock signal on line 51 from the pulse generator 50 and fed through the array of select boxes 42 is initially sent through four inverters and then to the gates of the precharge and evaluate transistors in the first row of full adders 54 and half adders 52 in that row. The four inverters 56 are selected to provide a sufficient time delay to permit the inputs to that row of adders 52, 54 to stabilize. The clock on line 51 is then delayed through four more inverters 56 and sent to the second row of adders 52, 54. By the time the second row of adders begins its evaluation, the first row of adders will have now stabilized its outputs and, thus, this operation continues providing time delays to the clock signal energizing rows of the adder to permit all rows to stabilize before proceeding to the next row and ultimately reaching the ripple carry adder 60 that produces the output product 58. In that regard, to add up the final sum and carry, the half adders and full adders are arranged as a 24 bit ripple carry adder 60.

Turning back to the digital signal processor shown in FIG. 1, the memory 24 in that embodiment is used to store the coefficients c1, c2, c3, ... cn used in the respective multipliers. Thus, n filter coefficients must be stored in the memory 24. In the embodiment shown in FIG. 1, the input signal at terminal 12 is provided to the multipliers 20, 28, 30, 32 after being passed through respective discrete delay elements 14, 16, 18. Nevertheless, another utilization for the memory 24 might be to provide such input samples by storing and reading out such samples at the appropriate times. Furthermore, in some applications, it is desired to have the ability to alter the coefficients as stored in the memory. Thus, in such situations, a programmable read only memory (PROM) may be used, whereas if the coefficients need not be altered then a standard read only memory (ROM) is sufficient. As described above, relative to the state of battery development, it is an object of this invention to provide a digital signal processor that not only can be formed as an integrated circuit, but that also has a very low power-consumption requirement. Therefore, it is advantageous to provide techniques for minimizing the power dissipation required in addressing the memory 24 by addressing circuit 26. One traditional addressing technique is to use a binary counter. Binary counters are well known and need not be described in detail here. On the other hand, the present inventors in determining to reduce the power requirement involved in addressing the memory have recognized that address bit transitions each involve a finite amount of power consumption. By reducing the number of address-bit transitions, the power consumption can be reduced accordingly. Thus, the present invention teaches to use a Gray code sequence counter to address the memory in the digital signal processor.

As is well known, a Gray code is a sequence of binary numbers such that for that any transition between words only one bit position changes. This is in contrast to the operation of a typical binary counter used to perform sequential memory addressing. For example, in a binary sequence the transition from 011111 to 100000 results in six bits changing their values. Thus, because the power dissipation of a counter is found to be proportional to the number of bits changing during a given count transition, the power dissipation is quite high. By definition, a Gray code has only one bit change per increment, thereby resulting in a substantial reduction of power dissipation. A six-bit Gray code counter that may be utilized as the address circuit 26 for addressing the memory 24 shown in FIG. 1 is shown in more detail in FIG. 5. At the right side of the circuit in FIG. 5, the transistors are formed as a dynamic CMOS structure. The Gray code counter of FIG. 5 employs NAND gates to implement the dynamic logic and only two transistors per counter bit are required to perform logic operation. Transistors 120, 122, 124, 126, 128, and 130 form the NAND gates. A clock signal on line 132 from clock generator 134 is fed to a respective number of pre-charging transistors, shown typically at 136. These transistors 136 are each connected to a node between the transistors of the NAND gates, which nodes are connected respectively NOR gates 138, 140, 142, 144, and 146, which respectively trigger flip-flops 148, 150, 152, 154, and 156. The outputs used for the address appear at terminals 166, 168, 170, 172, 174, and 176.

Figure 6:
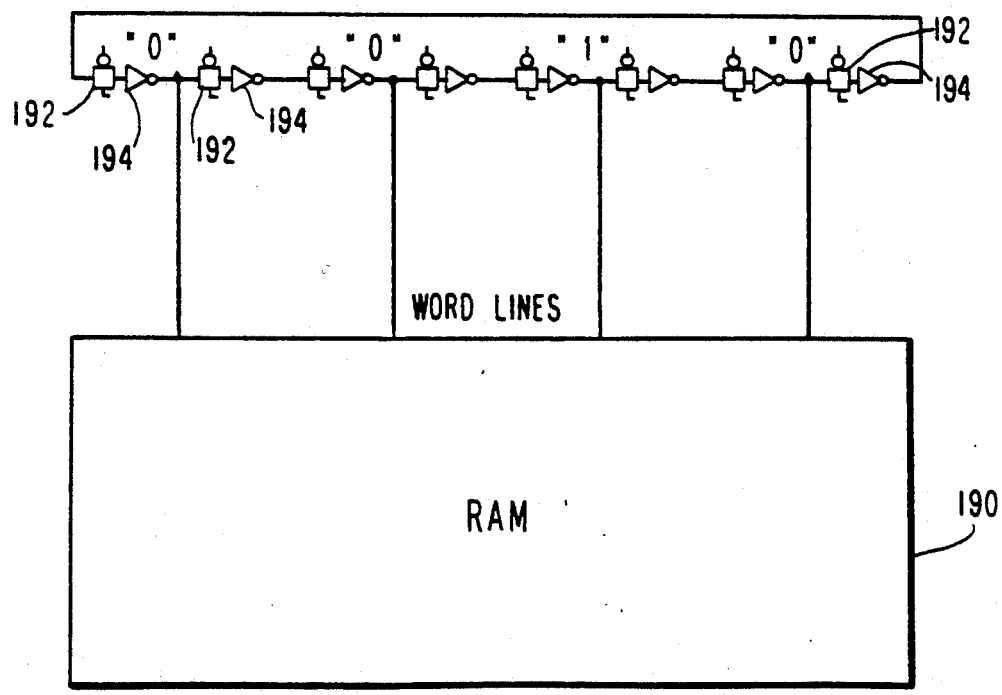
FIG. 6 is a circuit diagram of a shift register addressing circuit for addressing a memory according to an embodiment of the present invention.
Figure 5:
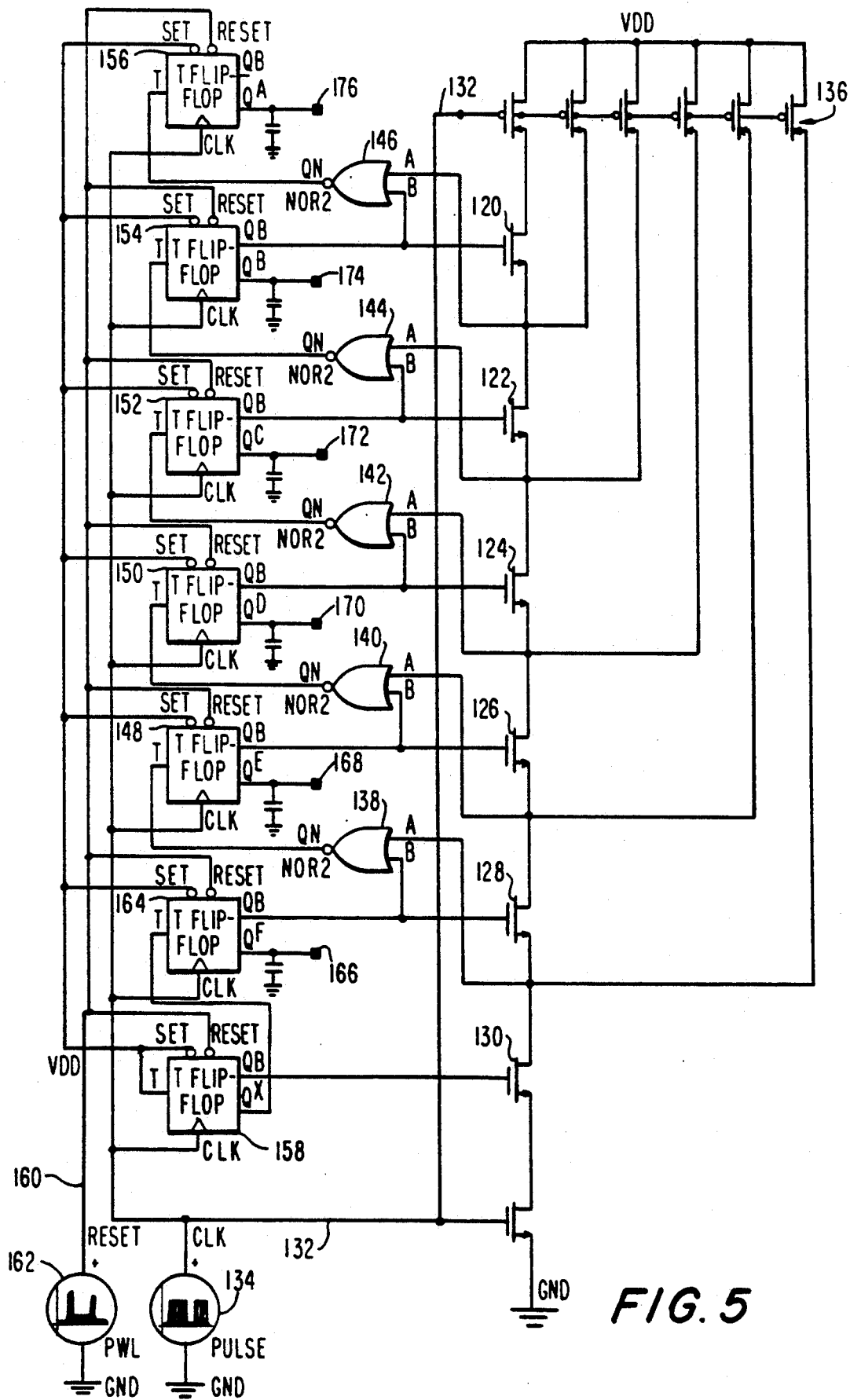
FIG. 5 is a circuit diagram of a Gray code counter for addressing a memory according to an embodiment of the present invention.

In place of the Gray code addressing system of FIG. 5, the present invention also contemplates the use of a one-bit wide circular shift register to perform the addressing function and such shift register is shown in FIG. 6. In this shift register the binary number "... 000010000 ..." is loaded into the register at the time of start up. The word line of the memory attached to the bit position containing the single logic "1" value will be driven high, thereby addressing a unique memory word. When the register shifts, the "1" value will shift one position, thereby addressing the next word in the memory, which as shown in FIG. 6 comprises a random access memory 190. Thus, the address is used to select a memory word that typically requires a row decode circuit to decode the address and select the appropriate word line. The decoding operation is eliminated by the shift register addressing of the present invention as shown in FIG. 6. Furthermore, the previously proposed system then required some circuit to generate the address that is being decoded and such address was typically generated using a binary counter. Such elements are not required following the teaching of the present invention and both the row decoder and binary counter can be eliminated using the circular one-bit wide shift register of FIG. 6, in which two dynamic latches are formed as a master and slave between each word line of memory 190. The master and slave units are each comprised of a CMOS transmission gate 192 and a static CMOS inverter 194, thereby forming a dynamic latch for providing the sequential addressing of memory 190.

Furthermore, in keeping with the object of this invention to reduce power consumption and provide a digital signal processing system suited for low-power applications, the use of the one-bit wide shift register for addressing means that only two bit positions are changing on any given shift, regardless of the length of the register.

Having described preferred embodiments with reference to the accompanying drawings, it is to be understood that the invention is not limited to those precise embodiments and that various changes and modifications could be effected by one skilled in the art without departing from the spirit or scope of the novel concepts of the invention, as defined in the appended claims.

What is claimed is:

1. A digital signal processor for processing a digital input signal, comprising:
  a memory containing a plurality of processing coefficients;
  delay means receiving the digital input signal and producing a plurality of delayed input signals;
  multiplier means connected respectively to said plurality of delayed input signals and connected to receive a processing coefficient from said memory;
  accumulator means for adding outputs from said multiplier means to form a filtered output signal, wherein said multiplier means comprises:
  an adder array formed of a plurality of dynamic CMOS adders arranged in a plurality of rows;
  a plurality of modified Booth recorders each receiving respectively selected bits of one of the coefficients from said memory and each producing outputs in accordance with the modified Booth algorithm;
  a plurality of selector means arranged in a number of rows equal in number to said plurality of modified Booth recorders and each receiving said outputs from said modified Booth recorders, selector means in a first of said rows receiving the one of said coefficients from said memory or said plurality of delayed input signals not input to said modified Booth recorders and producing respective partial products therefrom, and selector means in a remainder of said rows receiving outputs from said adder array and producing respective partial products therefrom;

delay means receiving and delaying a clock signal input thereto for producing a plurality of delayed clock signals;

said adder array formed of said plurality of dynamic CMOS adders arranged in said plurality of rows receiving said respective partial products from respective rows of said selector means and each dynamic CMOS adder being directly enabled respectively by said plurality of delayed clock signals for adding said partial products from said selector means; and dynamic CMOS adder means receiving said adder partial products form said adder array and producing a digital output signal therefrom fed to said accumulator means.

2. The digital signal processor according to claim 1, further comprising means for addressing said memory to selectively output said plurality of coefficients to said plurality of modified Booth recorders.

3. The digital signal processor according to claim 2, wherein said means for addressing comprises a one-bit wide circular shift register for producing sequential addresses fed to said memory.

4. The digital signal processor according to claim 2, wherein said means for addressing comprises a Gray code addressing generator for generating sequential addresses fed to said memory, wherein said sequential addresses have only a single bit transition between successive ones thereof.

5. A digital signal processor for processing an input signal in one or more multipliers with respective coefficients of a transfer function derived from a memory and an accumulator for adding outputs from one or more multipliers, each of the multipliers comprising:

a plurality of Booth recorder means receiving a multiplier consisting of one of a delayed input signal or a coefficient from the memory and producing therefrom a plurality of outputs corresponding to the modified Booth algorithm;

an adder array formed of a plurality of dynamic CMOS adders arranged in a plurality of rows; p1 a plurality of selector means arranged in a number of rows equal in number to said plurality of modified Booth recorders and each receiving said outputs from said modified Booth recorders, selector means in a first of said rows connected to receive a multiplicand consisting of the other of the coefficients from the memory or the delayed input signal and producing respective partial products therefrom, and selector means in a remainder of said rows receiving outputs from said adder array and producing respective partial products therefrom;

a clock generator for generating a clock signal and synchronizing said plurality of selector means therewith;

a delay circuit for delaying said clock signal and producing a plurality of delayed clock signals;

said adder array formed of said plurality of dynamic CMOS adders arranged in said plurality of rows respectively connected to receive said respective partial products from respective rows of said selector means and each dynamic CMOS adder enabled directly by selected ones of said plurality of delayed clock signals for producing added outputs of said partial products from said selector means; and dynamic CMOS adder means for adding outputs of said adder array and producing an output signal therefrom fed to said accumulator.

6. The digital signal processor according to claim 5, further comprising means for addressing said memory and selectively reading out said coefficients.

7. The digital signal processor according to claim 6, wherein said means for addressing said memory comprises a one-bit circular shift register for generating sequential addresses fed to said memory.

8. The digital signal processor according to claim 6, wherein said means for addressing said memory comprises a Gray code addressing generator for generating sequential addresses having only a single bit transition between successive addresses.

* * * * *